United States Patent [19]

Dresely et al.

[11] Patent Number: 5,075,193
[45] Date of Patent: Dec. 24, 1991

[54] DESENSITIZED QUINONE DIAZIDE COMPOUNDS UTILIZING MICROCRYSTALLINE CELLULOSE AS DESENSITIZING AGENT

[75] Inventors: Stefan Dresely, Reinheim; Ditmar Raulin, Einhausen, both of Fed. Rep. of Germany

[73] Assignee: Ciba-Geigy Corporation, Ardsley, N.Y.

[21] Appl. No.: 662,395

[22] Filed: Feb. 27, 1991

Related U.S. Application Data

[63] Continuation of Ser. No. 423,840, Oct. 19, 1989, abandoned.

[30] Foreign Application Priority Data

Oct. 27, 1988 [DE] Fed. Rep. of Germany ....... 3836586

[51] Int. Cl.$^5$ .............................. C03C 1/52; C03C 1/56
[52] U.S. Cl. ..................................... 430/169; 430/168; 430/189; 430/191; 430/193; 534/559; 534/556; 534/557
[58] Field of Search ....................... 534/556, 557, 559; 430/168, 169, 191, 192, 193, 196

[56] References Cited

U.S. PATENT DOCUMENTS

| | | | |
|---|---|---|---|
| 3,667,607 | 6/1972 | Brandt | 210/198.3 |
| 4,191,763 | 3/1980 | Gorman et al. | 514/201 |
| 4,346,171 | 8/1982 | Takiguchi et al. | 435/119 |
| 4,384,958 | 5/1983 | Wisebaker et al. | 210/198.3 |
| 4,424,270 | 1/1984 | Erdmann et al. | 430/166 |
| 4,468,467 | 8/1984 | Babb | 534/558 |
| 4,555,469 | 11/1985 | Erdmann et al. | 430/168 |

FOREIGN PATENT DOCUMENTS

0125587 12/1987 European Pat. Off.
3317883 11/1984 Fed. Rep. of Germany.

Primary Examiner—Charles L. Bowers, Jr.
Assistant Examiner—Christopher G. Young
Attorney, Agent, or Firm—Luther A. R. Hall

[57] ABSTRACT

The invention relates to desensitized quinone diazide compounds for use as photoactive components in radiation-sensitive compositions, such as, especially, photoresists, which compounds contain microcrystalline cellulose as desensitizing agent.

6 Claims, No Drawings

DESENSITIZED QUINONE DIAZIDE COMPOUNDS UTILIZING MICROCRYSTALLINE CELLULOSE AS DESENSITIZING AGENT

This is a continuation of application Ser. No. 423,840, filed on Oct. 19, 1989, now abandoned.

The invention relates to desentisized quinone diazide compounds for use as photoactive components in radiation-sensitive compositions, such as, especially, photoresists, which compounds contain microcrystalline cellulose as desensitising agent.

The term "photoresists" usually denotes photostructurable organic polymer materials used in photolithographic processes and related techniques, for example in the production of printing plates, printed electrical circuits and printed circuit boards, or in microelectronics in the production of integrated semiconductor components.

In the production of microelectronic semiconductor components, the semiconductor substrate material is coated with the photoresist; positive or negative photoresist relief structures are then obtained by image-wise exposure of the photoresist layer and subsequent development. The relief structures serve as masks for the actual structuring processes on the semiconductor substrate, such as etching, doping, and coating with metals, with other semiconductor materials or also with insulating materials. The photoresist masks are then generally removed again. The circuit structures of the microchips are formed on the substrate by carrying out a large number of such process cycles.

Positive photoresists of customary type basically contain, in an organic solvent, at least one resin that is soluble in aqueous alkalis and at least one photoactive quinone diazide compound which reduces the alkali-solubility of the resin. The action of radiation on photoresist layers produced with such compositions increases the alkali-solubility in the exposed areas as a result of photo-induced structural conversion of the quinone diazide compound into a carboxylic acid derivative so that, after development in aqeusous-alkaline development baths, positive photoresist relief structures are obtained.

The photoactive quinone diazide compounds preferably used are esterification products of 1,2-naphthoquinone-2-diazide-5-sulfonic acid or 1,2-naphthoquinone-2-diazide-4-sulfonic acid with low-molecular-weight aromatic hydroxy compounds, especially with hydroxybenzophenones, such as 2,3,4-trihydroxybenzophenone and 2,3,4,4'-tetrahydroxybenzophenone, and also with trihydroxybenzenes, such as 1,3,5-trihydroxybenzen. These naphthoquinone diazide compounds have a broad absorption in the near to middle UV wavelength range approximately from 300 to 450 nm. Intense emission lines of the mercury lamps customarily used in the projection apparatus, for example the lines at 313 nm, 334 nm, 365 nm, 405 nm and 436 nm, lie in that wavelength range.

Such quinone diazide compounds, that is to say, compounds that contain in the molecule at least one diazo group consisting of two nitrogen atoms, generally meet at least one of the criteria lad down by the explosives legislation of the Federal Republic of Germany. Although most of these substances are neither intended nor suitable for use as explosives in the true sense, they are, as "potentially explosive substances", subject to the provisions of that legislation. The production, isolation, storage and transportation as well as the further processing the of these substances in pure form can therefore be effected only when very expensive safety precautions are taken and only in relatively small amounts.

In view of the current widespread industrial use of these substances, it is desirable to make them available in stabilised form so that they are no longer potentially explosive and can be handled safely, in almost unlimited amounts and unhampered by legal requirements and safety measures.

When they are used in microelectronics, the purity of the photoresists and the components contained therein is of crucial importance. Important criteria are freedom from particles and the absence of doping metal ions and of moisture. The processing properties and imaging quality of the photoresist, and also the chip yield, depend to a very considerable extent on those criteria and, consequently, desensitised quinone diazide compounds are suitable for use in photoresists for microelectonics only if the quinone diazide compound can be freed from the desensitised form with a suitable degree of purity and in a state free of contamination, DE-OS 33 17 883 describes desensitised forms of potentially explosive quinone diazide compounds in which insoluble pulverulent inorganic adsorbents, such as, especially, kieselguhr, silica gel or aluminium oxide, act as desensitising agents. These desensitised forms are obtained by separating the quinone diazide compound from solution in an organic solvent by precipitation in the presence of such adsorbents. In that form, the compounds are stable and completely safe. The quinone diazide compounds can be regenerated again therefrom, for example for the production of photoresists, by introducing the desensitised form into the organic solvent and separating the inorganic material again, for example by filtration.

It has been found, however, that quinone diazide compounds desensitised in that manner introduce into the photoresists undesired amounts of metal ions, predominantly sodium ions, but also heavy metal ions which may provide to be a serious obstacle to the structuring of semiconductors. This introduction of metal ions is difficult to control both from the qualitative and the quantitative point of view, since it is generally not reproducible.

There was therefore a need to find alternative desensitising agents for quinone diazide compounds, which agents provide desensitisation of at least the same degree of effectiveness and which do not cause problems as regards content and introduction of metal ions when they are used in photoresists for semiconductor structuring.

It has surprisingly now been found that microcrystalline cellulose is suitable, in a manner fully analogous to that described in DE-OS 33 17 883 for inorganic adsorbents, as a desensitising agent for quinone diazide compounds but is at the same time considerably more advantageous as regards metal ion content and introduction in photoresists. The densensitised quinone diazide compounds obtainable by precipitation from solution in the presence of microcrystalline cellulose are stable and completely safe. By simple dissolution and removal of the desensitising agent by filtration, they can be readily regenerated for further use.

The invention therefore relates to desensitised quinone diazide compounds of use as photoactive components in radiation-sensitive compositions, which compounds contain microcrystalline cellulose as desensitising agent.

The invention also relates to the use of microcrystalline cellulose as desensitising agent for quinone diazide compounds.

The invention further more relates to a process for the preparation of desensitised quinone diazide compounds in which the latter are separated from solution in the presence of microcrystalline cellulose.

The microcrystalline cellulose acting according to the invention as desensitising agent for quinone diazide compounds is a common and readily available product which is manufactured industrially for a wide variety of purposes. It is usually marketed as a finely powdered product; the particle size is generally approximately from 0.01 to 0.5 mm but is completely non-critical as regards the purpose of the invention. Micrcrystalline cellulose is insoluble in water and virtually all organic solvents, especially the solvents customarily used in the photoresist technique. In the quinone diazide compounds desensitised according to the invention with microcrystalline cellulose, the desensitising agent is present in a proportion of from 10 to 90% by weight, preferably from 40 to 60% by weight and especially approximately 50% by weight.

According to the invention it is possible using the said material to convert any quinone diazide compounds customarily used in the preparation of radiation-sensitive compositions into a desensitised form, that is to say, a form that is no longer potentially explosive.

Especially preferred compounds of that type are the esterification products of 1,2-naphthoquinone-2-diazide-4-sulfonic acid with low-molecular-weight aromatic hydroxy compounds, especially with hydroxybenzophenones, such as 2,3,4-trihydroxybenzophenone and 2,3,4,4'-tetrahydroxybenzophenone, and with trihydroxybenzenes, such as 1,3,5-trihydroxybenzene.

The process according to the invention for the preparation of desensitised forms of such quinone diazide compounds which are potentially explosive in pure form is carried out by separating those compounds from their solutions by precipitation in the presence of microcrystalline cellulose which has been added to the solutions or the precipitating agent before precipitation. The quinone diazide compound is initially prepared in a manner known per se, but without isolating it in pure, dry and, therefore, potentially explosive form. Rather, the products which are still moist with water or solvent are dissolved in one of the common solvents; the desensitising agent according to the invention is then added and the quinone diazide compounds are separated in a form desensitised by microcrystalline cellulose by precipitation using one of the customary precipitating agents. Equally, the separation of the products in desensitised form can be carried out by adding their solutions to a mixture of desensitising agent and precipitating agent. The product can then be separated off by filtration and dried without problems. This process is therefore very simple to carry out and the amount of desensitising agent added is, within wide limits, non-critical. Effective desensitisation is achieved in all cases if the microcrystalline cellulose is added in a proportion of from 10 to 90% by weight, based on the amount of quinone diazide compounds. The most favourable results are obtained with a proportion of from 40 to 60% by wight, especially approximately 50% by weight.

Unlike the corresponding pure compounds, the quinone diazide compounds converted according to the process of the invention into a desensitised form are no longer potentially explosive in any way. This is proved in accordance with the provisions of the explosives legislation by specific tests (see Ullmann, Enzyklopädie der technischen Chemie, Vol. 21, pages 649–650 and page 652).

According to that explosives legislation, substances are classified as potentially explosive if a) in the falling weight test, an explosion takes place at an impact force of 40 joules (10 kg falling weight, 40 cm drop) or less, or b) in the steel shell test, an explosion occurs with a nozzle diameter of 2 mm or more, or c) in the friction test, an explosion, ignition or sizzling occurs at a pin load of 360N or less.

The quinone diazide compounds desensitised according to the invention meet none of the mentioned criteria for potential explosiveness. They can therefore be handled in the same manner as conventional chemicals without problems and in any amount.

The quinone diazide compounds desensitised according to the present invention are excellently suited to the preparation of radiation-sensitive compositions such as are used for producing positive relief images in the manufacture of printing plates are as photoresists in semiconductor manufacture. Their problem-free handling, owing to the absence of any risk of explosion, makes them especially valuable for industrial use in view of the great demand for and consumption of radiation-sensitive compositions.

The preparation of radiation-sensitive compositions that contain such quinone diazide compounds is effected by mixing the components in customary manner in accordance with formulations known per se in an organic solvent, the quinone diazide compound desensitised with microcrystalilne cellulose first being dissolved in the solvent and then the insoluble material being separated before or after mixing with the other components of the radiation-sensitive composition. This separation can be effected by filtration.

The process for the preparation of radiation-sensitive compositions is especially advantageous because the filtration of the finished solutions, which would be necessary in any case, is facilitated by the presence of the microcrystalline cellulose, and the addition of any filtration auxiliaries can therefore be dispensed with.

An especially surprising observation is that the microcrystalline cellulose can be filtered off more easily and considerably more rapidly than can the inorganic adsorbents according to DE-OS 33 17 883. In addition, the photoresist solutions which have been prepared with quinone diazide compounds desensitised according to the invention with microcrystlline cellulose can be subjected immediately and readily to the final ultrafine filtration through membrane filters (pore size generally from 0.1 to 1 $\mu$m). In contrast, in the case of desensitisation with inorganic adsorbents, further preliminary and intermediate filtration steps were necessary.

The photoresists so produced have a considerably lower metal ion content. For example, compared with photoresists based on quinone diazide compounds desensitised with inorganic adsorbents, the content of sodium ions, which are especially undesirable, can be reduced by a factor of from 50 to 100 and the content of iron ions can be reduced by a factor of 10.

A further completely unexpected and surprising effect achieved by the use in positive photoresists of quinone diazide compounds desensitised according to the invention with microcrystalline cellulose is the substantially improved storage stability of such photoresists, especially as regards the occurence of "black spots".

Particles of solid matter, such as ubiquitous dust particles or particles that are formed as a result of storage-induced changes in the photoresist solution, lead, especially where their size is of the same or a greater order of magnitude than that of the structures to be imaged, to undesirable losses in the yield of functional microchips owing to the occurrence of the so-called "black spots". Storage-induced changes, which result in deposits of particles of solid matter in the photoresist solution, are caused predominantly by uncontrolled decomposition in the photo-sensitive quinone diazide constituent. Such decomposition processes are command occur to varying extends and, despite the greatest possible standardisation in the production of both the staring materials and the photoresists, are production- and batch-determined. After a relatively long storage period it is therefore advisable to subject the photoresist solution to another fine filtration step immediately before use. Brown-stained filters are a reliable indication of the decomposition of quinone diazide compounds and of the occurrence of black spots, which reduce the chip yield.

In compassion with photoresists that are produced with non-desensitised quinone diazide compounds compounds or with quinone diazide compounds desensitised with inorganic adsorbents, the photoresists based on quinone diazide compounds desensitised with microcrystalline cellulose exhibit practically no storage-induced black spots whatwoever. The use of the quinone diazide compounds desensitised according to the invention therefore also results in photoresists that are substantially improved in terms of quality and application techniques.

EXAMPLE 1

Preparation of desensitised quinone diazide compounds 10 g of triester of 1,2-naphthoquinone-2-diazide-5-sulfonic acid with 1,3,5-trihydroxybenzene are dissolved in 40 ml of acetone. The solution is slowly added to an intensively stirred suspension of 10 g of microcrystalline cellulose in 150 ml of 1% hydrochloric acid, during which addition the quinone diazide compound is precipitated and isolated in cellulose-desensitised form by filtration.

Desensitised forms of: the triester, of 1,2-naphthoquinone-2-diazide-4-sulfonic acid with 1,3,5-trihydroxybenzene and the esterification product of 1,2-naphthoquinone-2-diazide-5-sulfonic acid with 2,3,4-trihydroxybenzophenone are prepared in an analogous manner.

In order to test potential explosiveness, the substances are investigated in accordance with the provisions of the explosives legislation using the falling weight test, the steel shell test an the friction test. None of the desensitised forms reacts to those tests whereas the pure substances exhibit a distinctly positive reaction in the falling weight test alone.

EXAMPLE 2

Preparation of photoresist solutions 2 positive photoresist formulations are prepared by mixing the components in each case with the composition: 30% by weight p-cresol novolak resin 10% by weight triester of 1,2-naphthoquinone-2-diazide-5-sulfonic acid with 1,3,5-trihydroxybenzen 60% by weight diethylene glycol dimethyl ether, the desensitised quinone diazide compound according to Example 1 being used for solution A and the quinone diazide compound desensitised with kieselguhr (according to DE-OS 33 17 883) being used for solution B. The desensitising agents are removed from the solutions by filtration and the solutions are converted into ready-for-use photoresist solutions by further filtration through a membrane filter having a pore size of 0.2 μm.

EXAMPLE 3

Metal ion content

After customary sample preparation, samples of photoresist solutions A and B from Example 2 are examined for metal ion content by atomic emission spectroscopy.

Result (values in μg/g analysis solution):

| Metal ion | A | B |
|---|---|---|
| Al | 0.05 | 0.70 |
| Ca | <0.05 | 0.30 |
| Cr | <0.05 | <0.05 |
| Cu | <0.05 | 0.06 |
| Fe | <0.05 | 0.50 |
| K | <0.50 | 0.90 |
| Li | <0.50 | <0.50 |
| Mg | <0.05 | 0.13 |
| Na | 0.10 | 6.70 |
| Ni | <0.05 | <0.05 |
| Zn | <0.50 | <0.50 |

It is found that solution A (according to the invention) has a considerably lower metal ion content. The sodium ion content is drastically reduced.

EXAMPLE 4

Storage stability

Samples of photoresist solutions A and B are stored for one week at 50° C.

The samples are then filtered through a 0.2 μm filter again.

Result

Solution A: no discoloration of the filter, no filtration residues Solution B: brownish discoloration of the filter, brown-black filtration residues insoluble in acetone.

What is claimed is:

1. A desensitized quinone diazide composition for use in making the photoactive component in a radiation-sensitive composition, said desensitized composition containing microcrystalline cellulose as the desensitizing agent and a quinone diazide compound, wherein said photoactive component is obtained by separating a quinone diazide compounds in the presence of microcrystalline cellulose as the desensitizing agent such that the quinone diazide compound is adsorbed by the microcrystalline cellulose.

2. A desensitized quinone diazide composition according to claim 1, wherein the quinone diazide compounds is an ester of 1,2-naphthoquinone-2-diazide-4-sulfonic acid or of 1,2-naphthoquinone-2-diazide -5-sulfonic acid with a low-molecular-weight aromatic hydroxy compound.

3. A desensitized quinone diazide composition according to claim 2, wherein the low-molecular-weight aromatic compound is a hdyroxybenzophenone or a trihydroxybenzene.

4. A desensitized quinone diazide composition according to claim 1, wherein the proportion of desensitizing agent is from 10 to 90% by weight.

5. A desensitized quinone diazide composition according to claim 4 wherein the proportion of desensitizing agent is from 40 to 60% by weight.

6. A process for the preparation of a desensitized quinone diazide composition, which comprises separating a quinone diazide compound from solution of a solvent by precipitation and filtration in the presence of microcrystalline cellulose as the desensitizing agent such that the quinone diazide compound is adsorbed by the microcrystalline cellulose.

* * * * *